(12) United States Patent
Kishino

(10) Patent No.: US 8,384,070 B2
(45) Date of Patent: Feb. 26, 2013

(54) ORGANIC ELECTROLUMINESCENCE DEVICE

(75) Inventor: Kengo Kishino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 377 days.

(21) Appl. No.: 12/882,339

(22) Filed: Sep. 15, 2010

(65) Prior Publication Data

US 2011/0108810 A1    May 12, 2011

(30) Foreign Application Priority Data

Nov. 10, 2009  (JP) ................................. 2009-256938

(51) Int. Cl.
*H01L 35/24* (2006.01)
(52) U.S. Cl. .................................. 257/40; 257/E51.001
(58) Field of Classification Search .................... 257/40, 257/E51.001
See application file for complete search history.

(56) References Cited

U.S. PATENT DOCUMENTS

| | | | |
|---|---|---|---|
| 6,224,966 B1 | 5/2001 | Sakai et al. ................... | 428/212 |
| 7,388,327 B2 | 6/2008 | Kishino et al. ................ | 313/504 |
| 7,466,073 B2 | 12/2008 | Kishino et al. ................ | 313/504 |
| 7,687,154 B2 | 3/2010 | Iwawaki et al. ............... | 428/690 |
| 7,704,609 B2 | 4/2010 | Igawa et al. ................... | 428/690 |
| 2007/0184302 A1 | 8/2007 | Iwawaki et al. ............... | 428/690 |

FOREIGN PATENT DOCUMENTS

JP    3949214 B2    7/2007

*Primary Examiner* — Anthony Ho
(74) *Attorney, Agent, or Firm* — Fitzpatrick, Cella, Harper & Scinto

(57) ABSTRACT

Provided is an organic electroluminescence device having high efficiency and a long lifetime. The organic electroluminescence device includes an anode; a cathode; and an organic compound layer interposed between the anode and the cathode, and including an emission layer formed of a first emission layer provided on an anode side and a second emission layer provided on a cathode side, in which the first emission layer contains a first host and a first dopant, the second emission layer contains a second host and a second dopant, the following relationship (a) is established between the first host and the first dopant, the following relationship (b) is established between the second host and the second dopant, and the following relationship (c) is established between the first host and the second host:

$$|LUMO(H_1)-LUMO(D_1)| > |HOMO(H_1)-HOMO(D_1)|, \quad (a)$$

$$|LUMO(H_2)-LUMO(D_2)| > |HOMO(H_2)-HOMO(D_2)|, \text{ and} \quad (b)$$

$$|HOMO(H_1)| > |HOMO(H_2)|. \quad (c)$$

3 Claims, 2 Drawing Sheets

ORGANIC ELECTROLUMINESCENCE DEVICE

BACKGROUND OF THE INVENTION

1. Field of the Invention

The present invention relates to an organic electroluminescence device.

2. Description of the Related Art

Organic electroluminescence devices (hereinafter referred to as "organic EL devices") are each an electron device obtained by interposing a thin film containing a fluorescent or phosphorescent organic compound between paired electrodes. An electron and a hole are injected from the respective electrodes. As a result, an exciton of the fluorescent or phosphorescent compound is produced. Each of the organic EL devices emits light when the exciton returns to its ground state. The organic EL devices have recently shown significant progress, and each have such characteristics as described below. Each of the devices shows high luminance at a low applied voltage, has a wide variety of luminous wavelengths, responds at a high speed, and enables the thinning and weight reduction of a light emitting device. Those characteristics suggest the potential of the devices to find use in assorted applications. In addition, research and development for improving the performance of each of the organic EL devices have been vigorously advanced in recent years.

The organic EL devices are each an electron device having an organic compound layer between paired electrodes. Here, the organic compound layer is a single layer or a laminate of multiple layers having at least an emission layer and obtained by appropriately inserting a charge transport layer (a hole transport layer or an electron transport layer) or a charge injection layer (hole injection layer or electron injection layer) between an electrode and the emission layer depending on purposes. In addition, the emission layer in the organic compound layer is not necessarily needed to be a single layer. Japanese Patent No. 3,949,214 discloses an organic EL device whose emission layer is formed of two layers for improving its light emitting efficiency and durability.

However, the organic EL device disclosed in Japanese Patent No. 3,949,214 had insufficient light emitting efficiency and insufficient durability. In addition, the organic EL device disclosed in Japanese Patent No. 3,949,214 is of a constitution in which: the ionization potential of a host increases from an anode to an emission layer on an anode side; and the electron affinity of a host reduces from a cathode to an emission layer on a cathode side. Therefore, hole and electron barriers arise at an interface between the host in the emission layer on the anode side and the host in the emission layer on the cathode side. As a result, charge accumulates at the interface, and quenching may occur owing to the charge. Further, a concern has been raised about the escape of a hole toward an electron transport layer in the organic EL device disclosed in Japanese Patent No. 3,949,214 because a hole barrier between the emission layer on the cathode side and the electron transport layer is small.

SUMMARY OF THE INVENTION

The present invention has been made to solve the above-mentioned problems, and an object of the present invention is to provide an organic EL device having high efficiency and a long lifetime.

More specifically, the present invention provides an organic EL device including: an anode; a cathode; and an organic compound layer interposed between the anode and the cathode, and including at least an emission layer, in which: the emission layer is formed of a first emission layer provided on an anode side and a second emission layer provided on a cathode side; the first emission layer contains a first host and a first dopant; the second emission layer contains a second host and a second dopant; the following relationship (a) is established between the first host and the first dopant; the following relationship (b) is established between the second host and the second dopant; and the following relationship (c) is established between the first host and the second host:

$$|LUMO(H_1)-LUMO(D_1)| > |HOMO(H_1)-HOMO(D_1)|, \quad (a)$$

$$|LUMO(H_2)-LUMO(D_2)| > |HOMO(H_2)-HOMO(D_2)|, \text{ and} \quad (b)$$

$$|HOMO(H_1)| > |HOMO(H_2)| \quad (c)$$

where: $LUMO(H_1)$, $LUMO(D_1)$, $LUMO(H_2)$, and $LUMO(D_2)$ represent LUMOs of the first host, the first dopant, the second host, and the second dopant, respectively; and $HOMO(H_1)$, $HOMO(D_1)$, $HOMO(H_2)$, and $HOMO(D_2)$ represent HOMOs of the first host, the first dopant, the second host, and the second dopant, respectively. Here, LUMO is an abbreviation of Lowest Unoccupied Molecular Orbital, and HOMO is an abbreviation of Highest Occupied Molecular Orbital.

According to the present invention, there can be provided an organic EL device having high efficiency and a long lifetime.

Further features of the present invention will become apparent from the following description of exemplary embodiments with reference to the attached drawings.

DESCRIPTION OF THE EMBODIMENTS

Figure 1A:
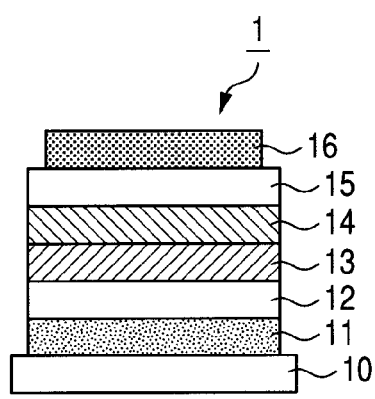
FIGS. 1A, 1B, 1C, and 1D are each a schematic sectional view illustrating an example of an embodiment in an organic EL device of the present invention.

An organic EL device of the present invention is formed of: an anode; a cathode; and an organic compound layer interposed between the anode and the cathode, and including at least an emission layer.

Hereinafter, the organic EL device of the present invention is described in detail with reference to drawings. First, symbols in the drawings are described.

Reference numerals 1, 2, 3, and 4 each represent an organic EL device, reference numeral 10 represents a substrate, reference numerals 11 and 19 each represent a transparent electrode, reference symbol 11a represents a reflective layer, reference numeral 12 represents a hole transport layer, reference numeral 13 represents a first emission layer, reference numeral 14 represents a second emission layer, reference numeral 15 represents an electron transport layer, reference numeral 16 represents a reflective electrode, reference numeral 17 represents a hole blocking layer, and reference numeral 18 represents an electron injection layer.

FIGS. 1A to 1D are each a schematic sectional view illustrating an example of an embodiment in the organic EL device of the present invention. The organic EL device 1 illustrated in FIG. 1A is obtained by laminating the transparent electrode 11 (anode), the hole transport layer 12, the first emission layer 13, the second emission layer 14, the electron transport layer 15, and the reflective electrode 16 (cathode) in the stated order on the substrate 10.

Figure 1B:
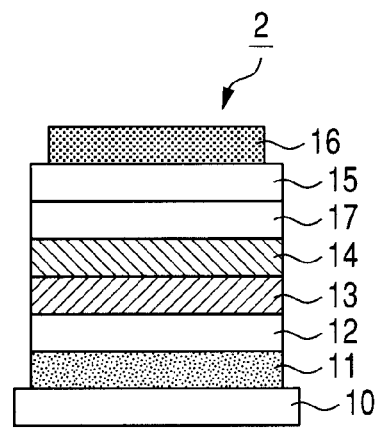

The organic EL device 2 illustrated in FIG. 1B is different from the organic EL device 1 illustrated in FIG. 1A in that the layer for preventing the diffusion of a hole (hole diffusion prevention layer 17) is provided between the second emission layer 14 and the electron transport layer 15.

Figure 1C:
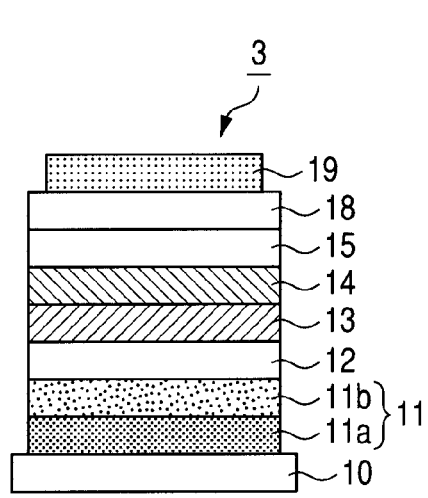

The organic EL device 3 illustrated in FIG. 1C is obtained by laminating the reflective layer 11a, the transparent electrode 11 (anode), the hole transport layer 12, the first emission layer 13, the second emission layer 14, the electron transport layer 15, the electron injection layer 18, and the transparent electrode 19 (cathode) in the stated order on the substrate 10.

Figure 1D:
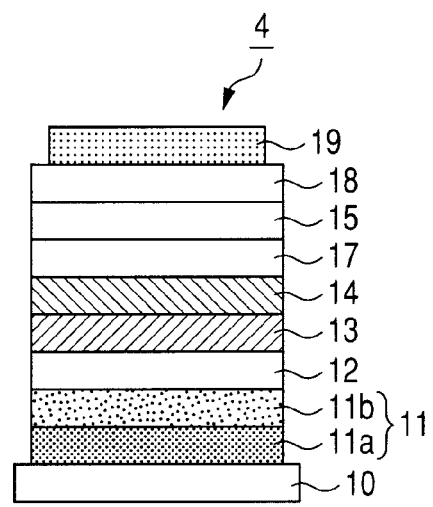

The organic EL device 4 illustrated in FIG. 1D is different from the organic EL device 3 illustrated in FIG. 1C in that the layer for preventing the diffusion of a hole (hole diffusion prevention layer 17) is provided between the second emission layer 14 and the electron transport layer 15.

It should be noted that the device constitutions illustrated in FIGS. 1A to 1D are each merely one specific example and the present invention is not limited to them.

As illustrated in each of FIGS. 1A to 1D, the emission layer of the organic EL device of the present invention is of a two-layer constitution. To be specific, the emission layer is a laminate formed of the first emission layer 13 provided on an anode side and the second emission layer 14 provided on a cathode side.

Each of the emission layers (13 and 14) contains a host and a dopant. That is, the first emission layer 13 contains a first host and a first dopant, and the second emission layer 14 contains a second host and a second dopant. It should be noted that the term "emission layer" as used in the present invention refers to a layer having a light emitting function in the organic compound layer provided between the electrodes. In addition, a host in each emission layer is a material serving as a main component out of the materials in the emission layer. To be additionally specific, the host is a material whose content in each emission layer is 50 wt % or more out of the materials in the emission layer. On the other hand, a dopant is a material that does not serve as a main component out of the materials in each emission layer. To be additionally specific, the dopant is a material whose content in each emission layer is 50 wt % or less out of the materials in the emission layer.

Figure 2:
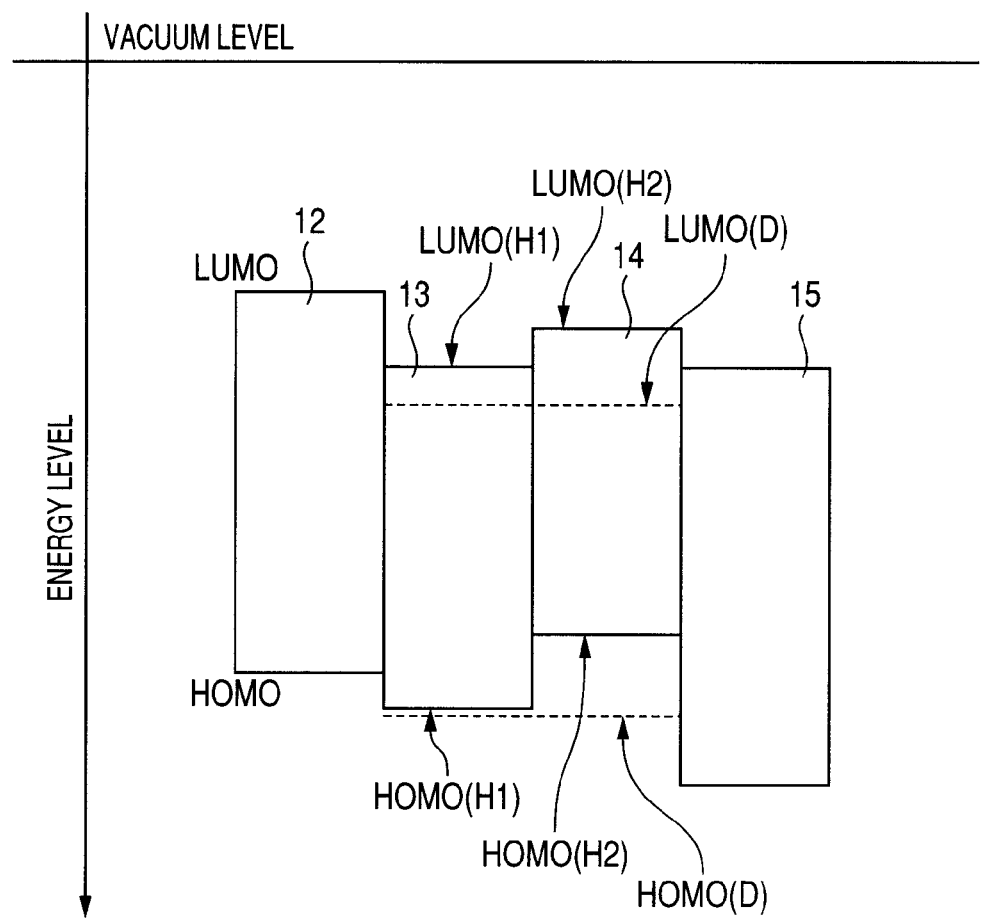
FIG. 2 is a view illustrating an energy diagram schematically illustrating the energy level of each layer of which the organic EL device of the present invention is formed.

FIG. 2 is a view illustrating an energy diagram schematically illustrating the energy level of each layer of which the organic EL device of the present invention is formed.

As illustrated in FIG. 2, in the present invention, the following relationship (a) is established between the first host and the first dopant in the first emission layer 13:

$$|LUMO(H_1)-LUMO(D_1)|>|HOMO(H_1)-HOMO(D_1)|. \quad (a)$$

In the relationship (a), LUMO($H_1$) and LUMO($D_1$) represent the LUMOs of the first host and the first dopant, respectively, and HOMO($H_1$) and HOMO($D_1$) represent the HOMOs of the first host and the first dopant, respectively.

Meanwhile, in the present invention, the following relationship (b) is established between the second host and the second dopant in the second emission layer 14:

$$|LUMO(H_2)-LUMO(D_2)|>|HOMO(H_2)-HOMO(D_2)|. \quad (b)$$

Charge in each emission layer progresses in the emission layer while moving back and forth between the electron levels of the host and the guest. In other words, the charge in the emission layer progresses in the emission layer while repeating the following process. That is, the charge is trapped by the host or the guest, or is detrapped from the host or the guest. In this case, the mobility of the charge reduces as differences in HOMO or LUMO between the host and the guest enlarge. Here, in the present invention, the above-mentioned relationships (a) and (b) are established. Accordingly, the frequency of an electron trap increases as compared with that of a hole trap, and hence the electron mobility of each of the emission layers (13 and 14) reduces as compared with the hole mobility of the emission layer. Thus, a light emitting region is unevenly distributed on the electron transport layer side. In general, an amine compound is frequently used as a constituent of the hole transport layer. A hole injected from the anode toward the emission layer interacts with the amine compound having a lone pair, and the interaction may cause a reduction in light emitting efficiency or durability. Therefore, the light emitting region must be unevenly distributed on the electron transport layer side.

In the present invention, the first host and the second host, which may be the same compound, are desirably different compounds, or specifically the following compounds. That is, the hole mobility of the first host is higher than that of the second host. Thus, the passage of charge does not occur smoothly at an interface between the first emission layer and the second emission layer, and the light emitting region can be expanded to the entire region of the second emission layer 14 (ranging from an interface between the second emission layer and the electron transport layer to an interface between the first emission layer and the second emission layer). Here, the following relationship (c) is desirably established between the first host and the second host in order that a region for trapping a hole and the light emitting region may be separated from each other. In this case, no charge barrier is present at the interface between the first host and the second host, and hence light emission can be achieved while redundant holes are prevented from accumulating. That is, a region where charge accumulates and the light emitting region can be separated from each other.

$$|HOMO(H_1)|>|HOMO(H_2)| \quad (c)$$

In addition, in the case where the relationship (c) is established, the following effect is obtained. That is, the freedom of host selection in consideration of the charge blocking property of each of the hole transport layer and the electron transport layer increases as compared with that in the case where hosts in the two kinds of emission layers are identical to each other or the case where the relationship of $|HOMO(H_1)|<|HOMO(H_2)|$ is established.

The organic EL device of the present invention, which must satisfy the above-mentioned relationships (a) to (c), preferably further satisfies the following relationship (d). The establishment of the following relationship (d) is effective in lengthening the lifetime of the device because the establishment can eliminate the accumulation of redundant electrons at the interface between the first emission layer and the second emission layer.

$$|LUMO(H_1)|>|LUMO(H_2)| \quad (d)$$

Any one of the following types (1) to (5) is conceivable as a light emitting mechanism that may occur at the interface between the first emission layer and the second emission layer in the organic EL device of the present invention:

(1) a direct excitation type in which charge is directly injected into each of the HOMO and LUMO of a dopant so that the dopant may be excited, (2) an indirect excitation type in which an exciton excited in the first host undergoes an energy transfer toward a dopant, (3) an indirect excitation type in which an exciton excited in the second host undergoes an energy transfer toward a dopant,
(4) an indirect excitation type in which an exciton excited in the first host undergoes an energy transfer toward a dopant via the second host, and
(5) an indirect excitation type in which an exciton excited in the second host undergoes an energy transfer toward a dopant via the first host.

As described above, the light emitting mechanism (4) is probably better than the light emitting mechanism (5) because the light emitting region is preferably as distant from the hole transport layer as possible from the viewpoints of the light emitting efficiency and the lifetime. Therefore, the above-mentioned relationship (d) is preferably established between the first host and the second host.

The hosts and the dopants in the emission layers (13 and 14) of which the organic EL device of the present invention is formed are preferably compounds each formed only of a hydrocarbon. A possible reason for the foregoing is as described below. When a structure having a lone pair such as nitrogen is used as a host or guest, an interaction between the host and the guest or an interaction with a peripheral material occurs. Accordingly, a compound formed only of a hydrocarbon (hydrocarbon compound) as an additionally stable compound that is not affected by an interaction between a host and a dopant to a very large extent is preferred.

The compound formed only of a hydrocarbon to be used as the first host, which is not particularly limited, has only to be a compound satisfying the relationship (c) and capable of accepting a hole from the hole transport layer. Examples of the first host include compounds each having an anthracene, tetracene, fluorene, pyrene, chrysene, naphthalene, phenanthrene, fluoranthene, or benzene ring as a basic skeleton.

Meanwhile, the compound formed only of a hydrocarbon to be used as the second host, which is not particularly limited, has only to be a compound capable of accepting an electron from the electron transport layer. To be specific, the same kind of a compound as the first host can be used.

Although a combination of the first host and the second host is not particularly limited, compounds different from each other in main basic skeleton that occupies a majority of each compound or compounds different from each other in steric structure are preferably combined. Here, the difference in steric structure can be roughly classified into two cases in terms of the structures of the compounds, or especially the lengths of the central axes of the compounds. That is, the case where skeletons of which a molecule is formed are bonded in the long axis direction of the molecule and the case where the skeletons are bonded in the short axis direction of the molecule are available. When all skeletons of which a molecule is formed are bonded in its long axis direction, the molecule is a linear compound, and hence a charge mobility may increase. On the other hand, when the skeletons are bonded in its short axis direction, the skeletons repel each other so that the molecule may be a compound having large steric hindrance. Accordingly, the charge mobility may reduce. A combination of such different steric structures may be important in moving the light emitting region to a center between the first emission layer and the second emission layer.

In the organic EL device of the present invention, a difference in HOMO between the hole transport layer and the first emission layer, which is not particularly limited, is preferably 0.1 eV or more, or more preferably 0.4 eV to 0.6 eV from the viewpoints of charge injecting property and charge blocking property. In addition, in the organic EL device of the present invention, a difference in LUMO between the electron transport layer and the second emission layer, which is not particularly limited, is preferably 0.1 eV or less, or more preferably 0 eV (that is, there is no barrier between the layers) from the viewpoint of electron accumulation.

Specific examples of the hosts used in the present invention are shown below. It should be noted that those compounds are merely specific examples and the present invention is not limited to them.

Compound 1

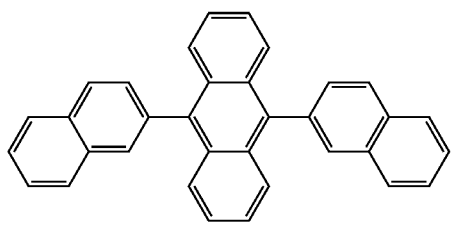

Compound 2

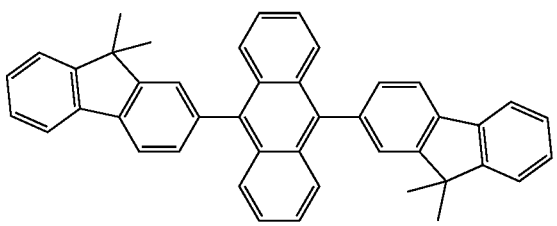

Compound 3

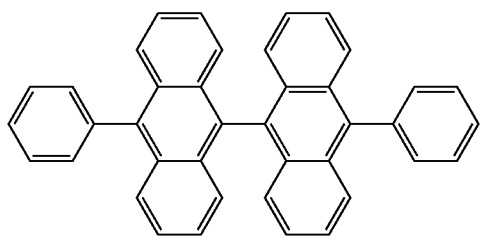

Compound 4

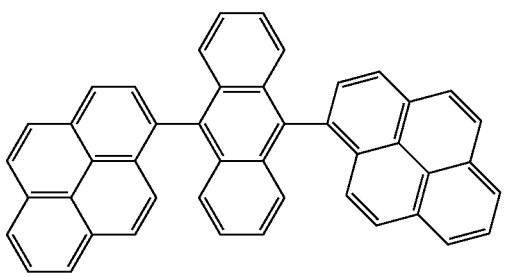

-continued
Compound 5
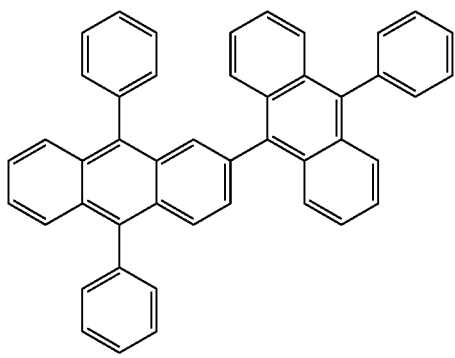
Compound 6
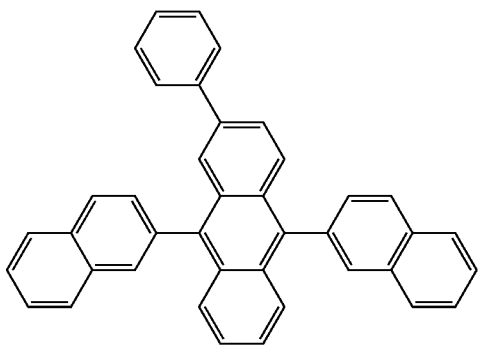
Compound 7
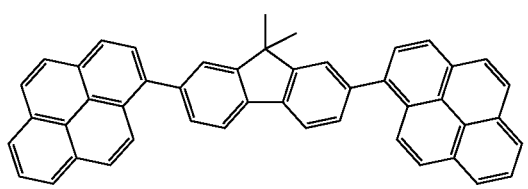
Compound 8
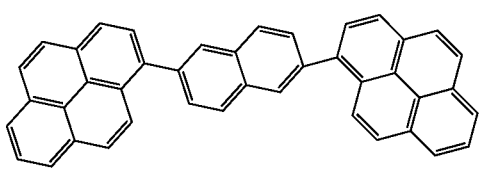
Compound 9
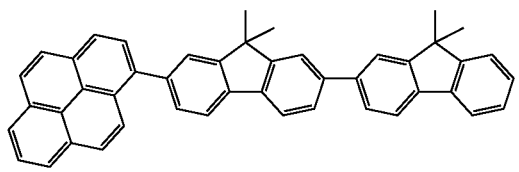
Compound 10
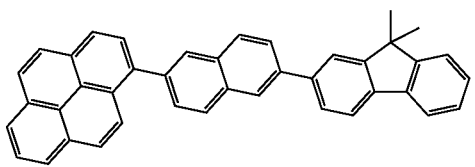
Compound 11
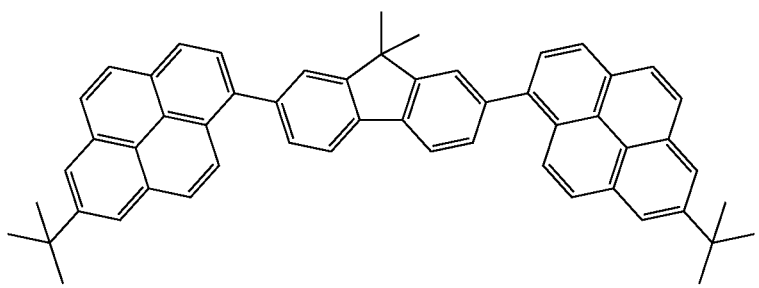
Compound 12
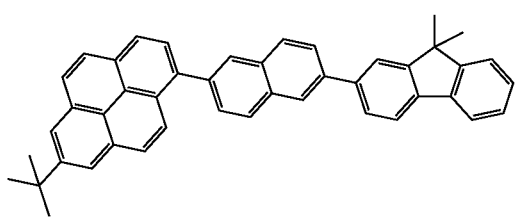
Compound 13
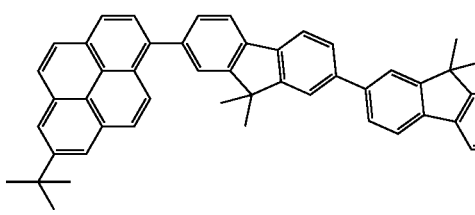
Compound 14
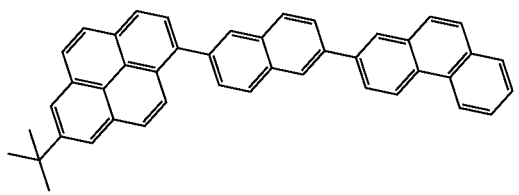
Compound 15
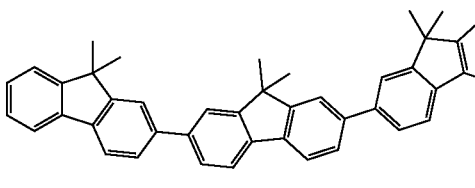

-continued
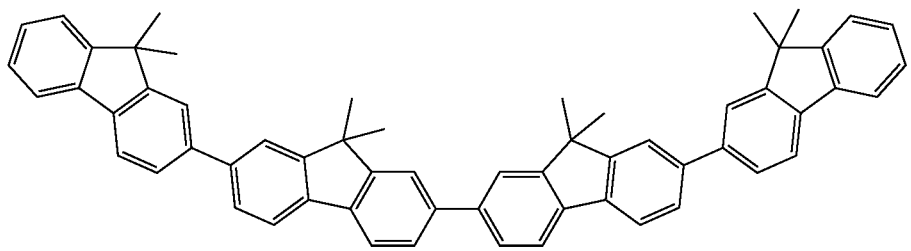
Compound 16
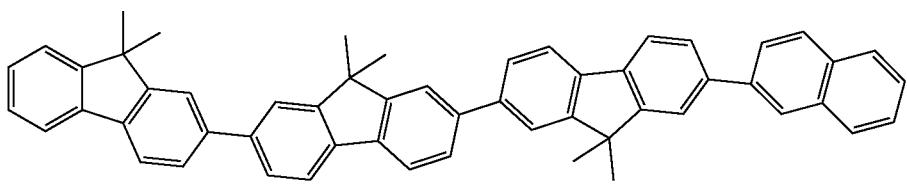
Compound 17
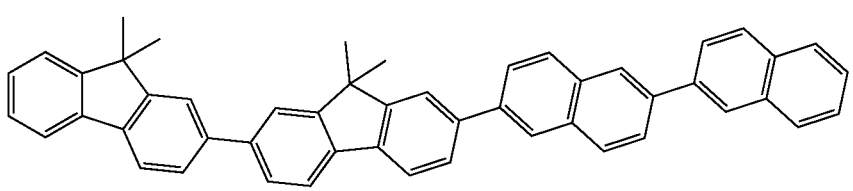
Compound 18
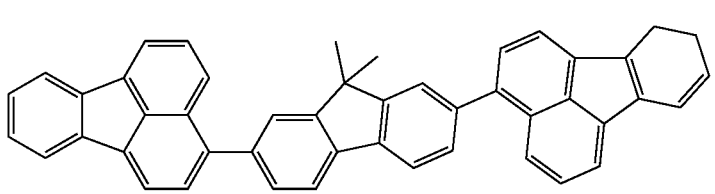
Compound 19
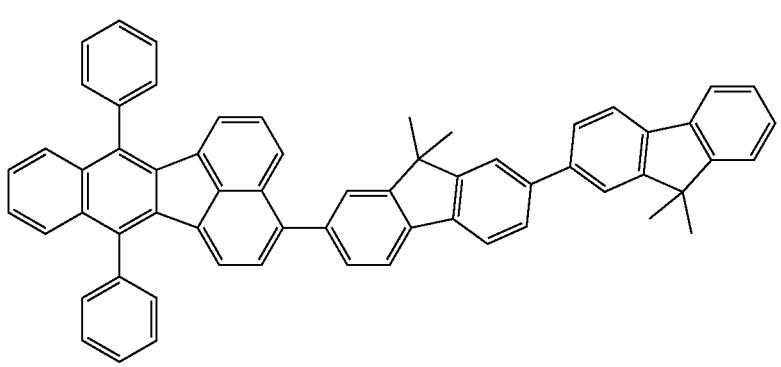
Compound 20
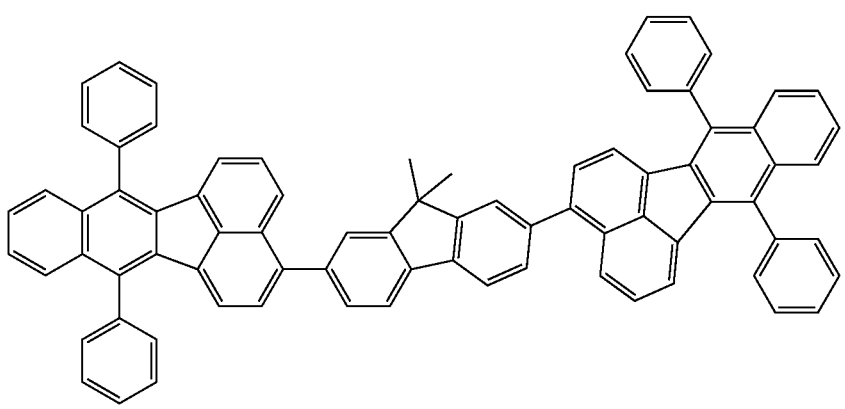
Compound 21

Compound 22

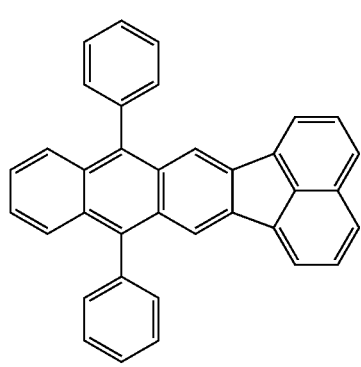

Compound 23

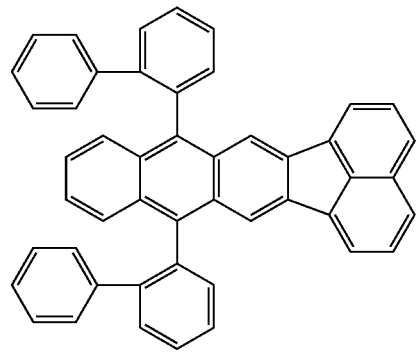

Compound 24

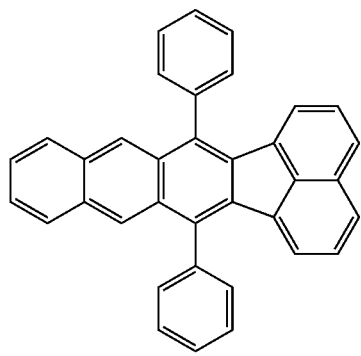

Compounds to be used as the dopants, which are not particularly limited, have only to satisfy the above-mentioned relationships (a) and (b) with the two kinds of hosts. Further, compounds each having a fluoranthene skeleton having a large absolute value for each of its HOMO and LUMO are preferred from the viewpoint of the oxidation stability of dopant materials. Specific examples of the dopants used in the present invention are shown below. It should be noted that those compounds are merely specific examples and the present invention is not limited to them.

Compound 26

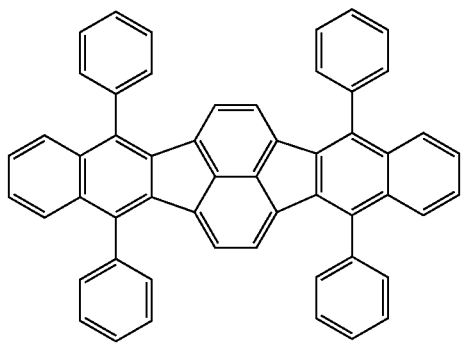

Compound 25

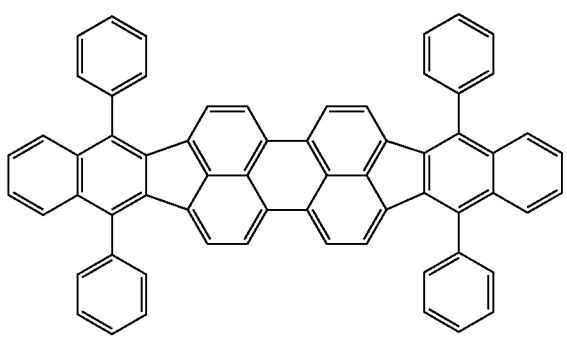

Compound 27

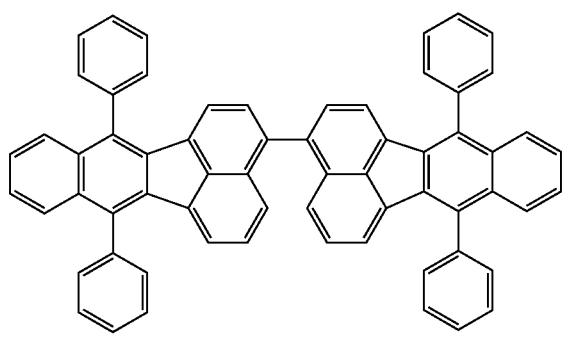

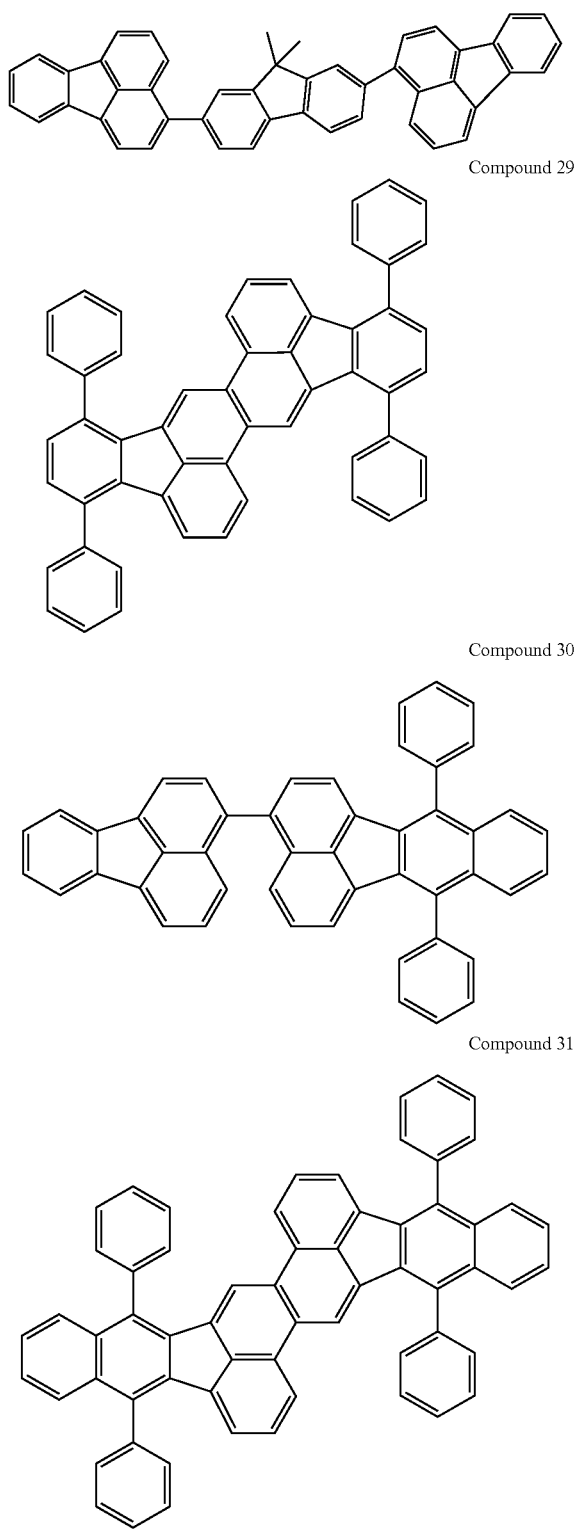

Compound 28
Compound 29
Compound 30
Compound 31

The organic EL device of the present invention can be preferably used as a monochromatic light emitting device for each of R, G, and B colors. It should be noted that, when the emission layer contains two or more kinds of emission materials different from each other in color type, a light emitting device having a high color purity cannot be obtained because an energy transfer occurs between the emission materials.

In the organic EL device of the present invention, at least one of the paired electrodes is preferably transparent as illustrated in FIG. 1. In addition, the electrodes are appropriately selected in consideration of electron injecting property and hole injecting property.

A constituent of the transparent electrode is, for example, an ITO or IZO. Meanwhile, a constituent of the reflective electrode is, for example, a metal material such as aluminum, gold, platinum, chromium, or copper, or an alloy obtained by combining two or more kinds of these metal materials.

The organic EL device of the present invention is preferably subjected to such contrivance as to be isolated from oxygen or moisture as required. For example, the device is preferably sealed with a sealing can or a sealing film containing at least one of organic and inorganic substances.

The organic EL device of the present invention may be used as one unit, or may be used as one member of an apparatus formed of multiple devices such as a display apparatus. When the organic EL device of the present invention is used as a member of a display apparatus or the like, the constitution of each of all devices may be the constitution of the present invention, or the constitution of each of an arbitrary number of devices may be the constitution of the present invention.

In addition, in the case of an apparatus provided with multiple organic EL devices, for example, passive driving or active matrix driving can be adopted as a method of driving each device. In addition, when the number of organic EL devices is two or more, the respective organic EL devices may emit light beams of a single color, or may emit light beams of multiple colors. When multiple kinds are available as the luminescent colors of the organic EL devices, full-color light emission can be achieved. In addition, the organic EL device of the present invention may be a device of the so-called bottom emission structure in which light can be extracted from a substrate side, or may be a device of the so-called top emission structure in which light is extracted from the side opposite to the substrate side. In the case of the top emission structure, an electron injection layer is preferably provided from the viewpoint of a reduction in voltage at which the device is driven, and further, an alkali metal (especially cesium carbonate) is preferably incorporated into the electron injection layer, though the layer is not particularly limited.

The organic EL device of the present invention can be used as a constituent member of a display apparatus such as a display. For example, the organic EL device of the present invention can be used as a member of which a pixel portion or sub-pixel portion of the display is formed. It should be noted that the term "display" as used herein comprehends not only a display apparatus to be mounted on a television set, personal computer, digital camera, camcorder, or the like but also a display apparatus to be mounted on a vehicle body. In addition, the organic EL device of the present invention may be used as illumination, or may be used as an exposure light source for the display portion or photosensitive member of an electrophotographic image forming apparatus or the like.

EXAMPLES

Compounds Used

Compounds shown below were each used as one of the first host, the second host, and the dopants in each of examples and comparative examples to be described later. It should be noted that the category "dopant" is common to the first dopant and the second dopant.

(First host)
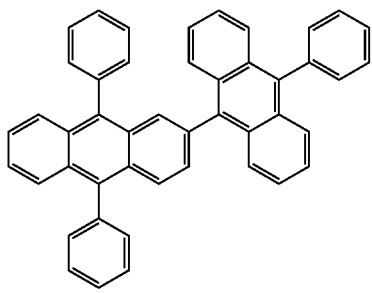
Compound 5
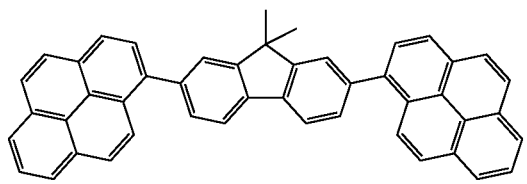
Compound 7
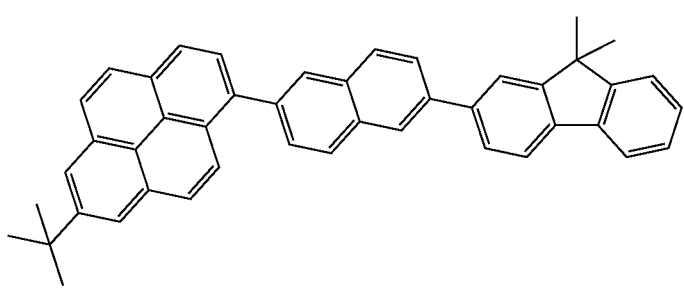
Compound 12
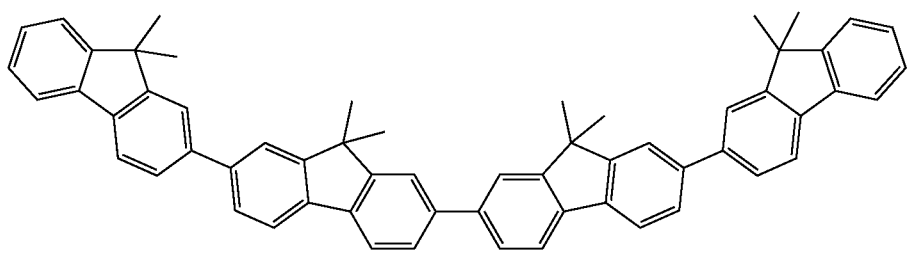
Compound 16
(Second host)
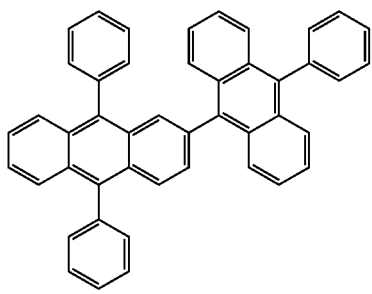
Compound 5
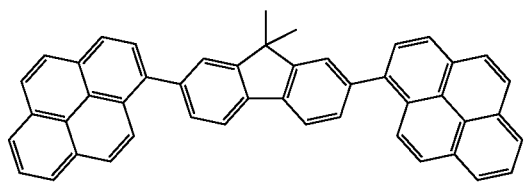
Compound 7
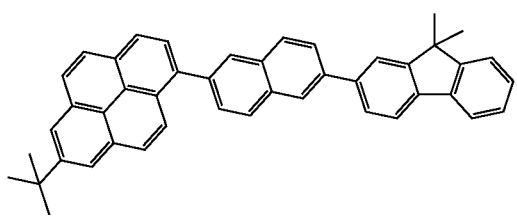
Compound 12
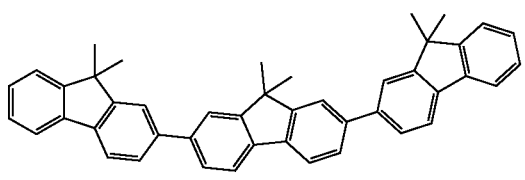
Compound 15

Compound 24

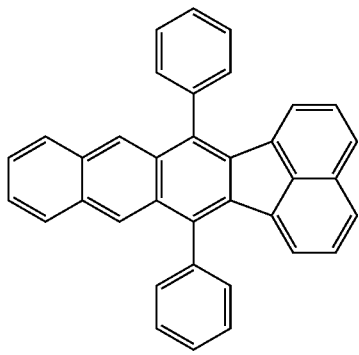

(Dopants)

Compound 26

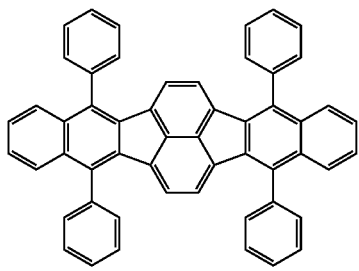

Compound 28

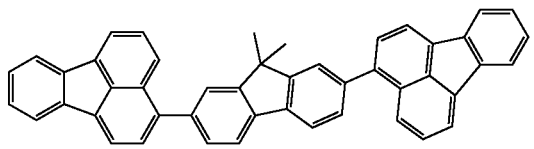

Compound 34

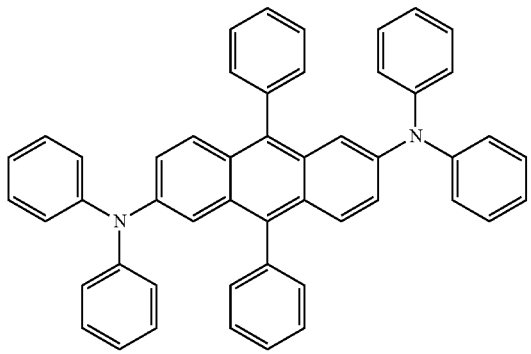

(Evaluation for HOMO/LUMO)

The first host, the second host, and the dopants were each evaluated for its HOMO and LUMO by the following methods. Table 1 shows the results.

A. Evaluation Method for HOMO

A thin film having a thickness of 20 nm was formed on an aluminum substrate, and then the thin film was subjected to measurement with an AC-2 (manufactured by RIKEN KEIKI Co., Ltd.).

B. Evaluation Method for LUMO

A thin film having a thickness of 20 nm was formed on a quartz substrate, and the optical band gap (absorption edge) of the thin film as a material to be measured was determined with a spectrophotometer (manufactured by Hitachi High-Technologies Corporation). The sum of the optical band gap and the HOMO was defined as an LUMO.

TABLE 1

|  | Compound | HOMO [eV] | LUMO [eV] |
|---|---|---|---|
| First host | Compound 5 | −5.81 | −2.93 |
|  | Compound 7 | −5.74 | −2.80 |
|  | Compound 12 | −5.72 | −2.70 |
|  | Compound 16 | −5.81 | −2.88 |
| Second host | Compound 5 | −5.81 | −2.93 |
|  | Compound 7 | −5.74 | −2.80 |
|  | Compound 12 | −5.72 | −2.70 |
|  | Compound 15 | −5.81 | −2.88 |
|  | Compound 24 | −5.67 | −3.05 |
| Dopant | Compound 26 | −5.74 | −3.25 |
|  | Compound 28 | −5.85 | −3.06 |
|  | Compound 34 | −5.38 | −2.83 |

Example 1

In this example, an organic EL device having the device constitution illustrated in FIG. 1C was produced by the following method.

First, Al was formed into a film on a glass substrate (transparent substrate 10) by a sputtering method. Thus, the reflective layer 11a was formed. Next, an indium zinc oxide (IZO) was formed into a film on the reflective layer 11a by a sputtering method. Thus, the transparent electrode 11 was formed. In this case, the thickness of the transparent electrode 11 was set to 80 nm. Next, an acrylic resin was applied, and then the resultant was subjected to patterning by a photolithography step. Thus, a pixel separation film having a desired pattern shape was formed. It should be noted that the electrode area of the organic EL device partitioned by the formation of the pixel separation film is 3 mm$^2$.

Next, the layers of the organic compound layer shown in Table 2 below were sequentially formed on the transparent electrode 11 by a vacuum deposition method. It should be noted that, specifically, the vacuum deposition was performed by resistive heating in a vacuum chamber having a pressure of $10^{-5}$ Pa.

TABLE 2

| Organic compound layer | Constituent | Thickness |
|---|---|---|
| Hole transport layer | Compound 32 | 20 nm |
| First emission layer | Compound 7 (First host), Compound 26 (First dopant) (First host:First dopant = 98:2 (weight ratio)) | 10 nm |
| Second emission layer | Compound 24 (Second host), Compound 26 (Second dopant) (Second host:Second dopant = 98:2 (weight ratio)) | 10 nm |
| Electron transport layer | Compound 33 | 10 nm |
| Electron injection layer | Compound 32, Cesium carbonate (Compound 32:Cesium carbonate = 97:3 (weight ratio)) | 50 nm |

In addition, the structural formulae of Compounds 32 and 33 used in this example are shown below.

Compound 32

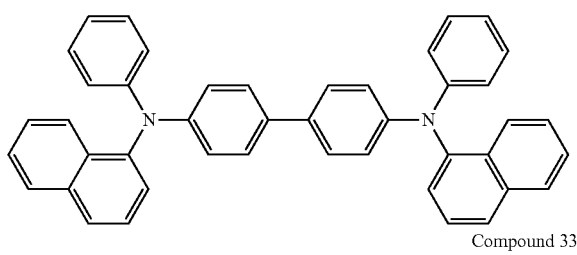

Compound 33

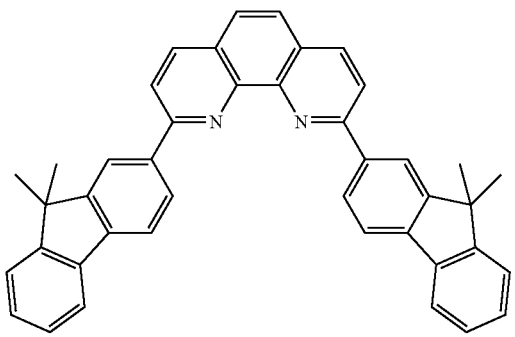

Next, an IZO was formed into a film on the electron injection layer 18 by a sputtering method. Thus, the transparent electrode 19 was formed. In this case, the thickness of the transparent electrode 19 was set to 30 nm. Next, the resultant was sealed with a glass cap with a hygroscopic material under an inert gas atmosphere. As a result of the foregoing, the organic EL device was obtained.

The resultant organic EL device was continuously driven at 100 mA/cm$^2$, and the deterioration ratio of its luminance after a lapse of 100 hours was measured. Table 3 shows the result. It should be noted that the light emission of the organic EL device produced in this example was green, monochromatic light emission.

Example 2

An organic EL device was produced in the same manner as in Example 1 except that: Compound 5 was used instead of Compound 7 as the first host; and Compound 7 was used instead of Compound 24 as the second host. The resultant device was evaluated in the same manner as in Example 1. Table 3 shows the results.

Comparative Example 1

An organic EL device was produced in the same manner as in Example 2 except that Compound 5 was used instead of Compound 7 as the second host. The resultant device was evaluated in the same manner as in Example 1. Table 3 shows the results.

Comparative Example 2

An organic EL device was produced in the same manner as in Example 1 except that Compound 34 was used instead of Compound 26 as each dopant. The resultant device was evaluated in the same manner as in Example 1. Table 3 shows the results.

Example 3

An organic EL device was produced in the same manner as in Example 1 except that: Compound 16 was used instead of Compound 7 as the first host; Compound 12 was used instead of Compound 24 as the second host; and Compound 28 was used instead of Compound 26 as each dopant. The resultant device was evaluated in the same manner as in Example 1. Table 3 shows the results. It should be noted that the light emission of the organic EL device produced in this example was blue, monochromatic light emission.

Comparative Example 3

An organic EL device was produced in the same manner as in Example 3 except that: Compound 12 was used instead of Compound 16 as the first host; and Compound 15 was used instead of Compound 12 as the second host. The resultant device was evaluated in the same manner as in Example 1. Table 3 shows the results.

TABLE 3

| | Luminescent color | First emission layer | | Second emission layer | | |HOMO(H1)| − |HOMO(H2)| | |LUMO(H1)| − |LUMO(H2)| | Luminance deterioration ratio [%] |
|---|---|---|---|---|---|---|---|---|
| | | |LUMO(H1) − LUMO(D1)| | |HOMO(H1) − HOMO(D1)| | |LUMO(H2) − LUMO(D2)| | |HOMO(H2) − HOMO(D2)| | | | |
| Example 1 | Green | 0.45 | 0.00 | 0.20 | 0.07 | 0.07 | −0.25 | 8 |
| Example 2 | Green | 0.32 | 0.07 | 0.45 | 0.00 | 0.07 | 0.13 | 6 |
| Comparative Example 1 | Green | 0.32 | 0.07 | 0.32 | 0.07 | 0.00 | 0.00 | 17 |
| Comparative Example 2 | Green | 0.03 | 0.36 | 0.22 | 0.29 | 0.07 | −0.25 | 40 |
| Example 3 | Blue | 0.18 | 0.04 | 0.36 | 0.13 | 0.09 | 0.18 | 25 |
| Comparative Example 3 | Blue | 0.18 | 0.04 | 0.18 | 0.04 | 0.00 | 0.00 | 50 |

As can be seen from Table 3, luminance deterioration under a continuous driving condition can be suppressed without any reduction in light emitting efficiency by satisfying the following relationships (a) to (c), or especially the following relationship (c):

$$|LUMO(H_1) - LUMO(D_1)| > |HOMO(H_1) - HOMO(D_1)| \quad (a)$$

$$|LUMO(H_2) - LUMO(D_2)| > |HOMO(H_2) - HOMO(D_2)|, \text{ and} \quad (b)$$

$$|HOMO(H_1)| > |HOMO(H_2)|. \quad (c)$$

Further, the lifetime of a device can be lengthened by satisfying the following relationship (d):

$$|LUMO(H_1)| > |LUMO(H_2)|. \quad (d)$$

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-256938, filed Nov. 10, 2009, which is hereby incorporated by reference herein in its entirety.

What is claimed is:

1. An organic electroluminescence device, comprising:
an anode;
a cathode; and
an organic compound layer interposed between the anode and the cathode, and including at least an emission layer, wherein:
the emission layer comprises a first emission layer provided on an anode side and a second emission layer provided on a cathode side;
the first emission layer contains a first host and a first dopant;
the second emission layer contains a second host and a second dopant;
the following relationship (a) is established between the first host and the first dopant;
the following relationship (b) is established between the second host and the second dopant; and
the following relationship (c) is established between the first host and the second host:

$$|LUMO(H_1) - LUMO(D_1)| > |HOMO(H_1) - HOMO(D_1)|, \quad (a)$$

$$|LUMO(H_2) - LUMO(D_2)| > |HOMO(H_2) - HOMO(D_2)|, \text{ and} \quad (b)$$

$$|HOMO(H_1)| > |HOMO(H_2)| \quad (c)$$

where:
LUMO(H$_1$), LUMO(D$_1$), LUMO(H$_2$), and LUMO(D$_2$) represent LUMOs of the first host, the first dopant, the second host, and the second dopant, respectively; and
HOMO(H$_1$), HOMO(D$_1$), HOMO(H$_2$), and HOMO(D$_2$) represent HOMOs of the first host, the first dopant, the second host, and the second dopant, respectively.

2. The organic electroluminescence device according to claim 1, wherein the following relationship (d) is further established:

$$|LUMO(H_1)| > |LUMO(H_2)| \quad (d).$$

3. The organic electroluminescence device according to claim 1, wherein the first host, the first dopant, the second host, and the second dopant comprise compounds each formed only of a hydrocarbon.

* * * * *